United States Patent [19]

Ooms

[11] 4,316,151
[45] Feb. 16, 1982

[54] PHASE LOCKED LOOP FREQUENCY SYNTHESIZER USING MULTIPLE DUAL MODULUS PRESCALERS

[75] Inventor: William J. Ooms, Hazelcrest, Ill.
[73] Assignee: Motorola, Inc., Schaumburg, Ill.
[21] Appl. No.: 121,333
[22] Filed: Feb. 13, 1980
[51] Int. Cl.³ .................. H03K 21/36; H03L 7/18
[52] U.S. Cl. .................. 331/1 A; 328/14; 328/42; 328/46; 328/48; 331/16; 331/25
[58] Field of Search .............. 331/1 A, 16, 18, 25; 328/14, 39, 41, 42, 46, 48, 155; 235/92 CC

[56] References Cited

U.S. PATENT DOCUMENTS

| | | | |
|---|---|---|---|
| 3,805,192 | 4/1974 | Ocnaschek et al. | 331/25 X |
| 3,811,092 | 5/1974 | Charbonnier | 328/39 |
| 3,849,635 | 11/1974 | Freedman | 235/92 CC |
| 3,959,737 | 5/1976 | Tanis | 331/1 A |
| 3,976,946 | 8/1976 | Schröder | 328/39 |
| 4,033,633 | 7/1977 | Miller et al. | 303/97 |
| 4,053,739 | 10/1977 | Miller et al. | 328/39 X |
| 4,121,162 | 10/1978 | Alberkrack et al. | 331/1 A X |
| 4,184,068 | 1/1980 | Washburn | 328/48 X |

Primary Examiner—Siegfried H. Grimm
Attorney, Agent, or Firm—James A. Scheer; James W. Gillman

[57] ABSTRACT

An improved frequency synthesizer suitable for use in mobile and portable radio applications using multiple dual modulus prescalers to achieve high frequency operation and low current drain. A first high speed prescaler of limited size is used in conjunction with a second prescaler to avoid the use of one large high speed prescaler to attain high frequency operation. Consequently, the frequency synthesizer can be constructed using only a minimum amount of high speed, high current drain logic thereby reducing costs and power consumption.

9 Claims, 2 Drawing Figures

PHASE LOCKED LOOP FREQUENCY SYNTHESIZER USING MULTIPLE DUAL MODULUS PRESCALERS

BACKGROUND OF THE INVENTION

This invention relates generally to the electronic signal processing art and in particular to an improved frequency synthesizer using multiple dual modulus prescalers.

DESCRIPTION OF THE PRIOR ART

Digital frequency synthesizers commonly employ standard phase locked loop circuitry wherein a controlled oscillator signal is divided by a loop divider. The output of the loop divider is fed back and compared in a phase comparator to a reference frequency signal. Phase comparator generates a control signal which is then coupled to the controlled oscillator, thereby providing an output signal from the control oscillator which has the desired frequency. The loop divider produces an output signal in response to every nth input pulse thereby dividing the input frequency by n. The output frequency of the VCO will therefore be locked to N times the reference frequency (i.e., $F_{VCO} = N_T \times F_{REF}$).

The reference frequency is determined by the desired VCO frequency increments. This is of particular importance in the radio communication art since channel spacing will therefore be related to the reference frequency. As smaller increments are needed, the reference frequency must be lowered. With a lower reference frequency, however, the short term stability decreases and the phase noise increases.

Previous techniques employed in digital frequency synthesizers have used a single programmable divider as the loop divider. This approach has very serious problems in synthesizers used at very high frequencies. A suitable divider for a high frequency synthesizer would require a large divider using high speed logic which would make it difficult to interface with the rest of the synthesizer and it would be very expensive to integrate due to the large chip size required. A more serious disadvantage is the fact that such a loop divider would draw a very large current making it unsuitable for mobile or portable applications.

One approach to the solution of these problems is the use of a high speed prescaler followed by a low speed programmable counter. This permits the use of lower speed logic for most of the loop divider reducing costs and current drain. However, a major disadvantage is that the loop divider using a fixed prescaler can be reprogrammed only in increments equal to multiples of the prescaler modulus. In radio communications applications this requires a decrease in the reference frequency, which must equal the desired channel spacing divided by the prescaler count factor. Since it is desirable to have the reference frequency as high as possible and since it cannot be higher than channel spacing, it is advantageous to keep the reference frequency equal to the channel spacing.

To deal with this problem another technique has been developed using a high speed dual modulus prescaler and two programmable counters. The first counter is programmed to divide the output of the dual modulus prescaler by a number $N_P$. The second counter, often referred to as "swallow counter" is programmed to divide the output of the dual modulus prescaler by a number $N_S$, which is less than $N_p$. The output of the controlled oscillator is divided by the prescaler, with first modulus $P+1$, and applied to both counters. When the count in the two counters reaches the number $N_S$, the swallow counter actuates the dual modulus prescaler to a new modulus P. The output of the prescaler then continues to be divided by the first counter. At the end of the count $N_p$, the counters must be reset. The total divisor of the loop divider $N_T$ is given by the formula:

$$N_T = (P+1)A + P(N_P - A) = PN_P + A$$

as discussed at page 1003 of the Motorola McMoss Handbook, printed in 1974 by Motorola, Inc. In the above equation it can be seen that the dual modulus prescaler approach permits a change in the divide ratio in increments of one merely by reprogramming the value of A and thereby permits the reference frequency to be equal to the channel spacing.

For very high frequency synthesizers this dual modulus prescaler approach still requires a large prescaler using high speed logic. Consequently, this approach results in high current drain and high cost. Thus, it is desirable to provide a high frequency synthesizer which draws less current and is less expensive to manufacture for very high frequency applications.

SUMMARY OF THE INVENTION

It is an object of this invention to provide a frequency synthesizer which is particularly suited for very high frequency radio communications applications.

It is another object of the invention to provide an improved frequency synthesizer which utilizes multiple dual modulus prescalers.

Briefly, in accordance with one embodiment of the invention, an improved frequency synthesizer is provided which is capable of operating at very high frequencies as a result of using two dual modulus prescalers as part of the loop dividing function. In the frequency synthesizer a reference signal is applied to a first input of a phase comparator. This reference signal is then compared to a signal applied to second input of the phase comparator and a control signal representative of the phase difference between the two signals is generated. This control signal is then applied to a signal controlled oscillator which produces an oscillator signal of frequency f in response to the control signal. The controlled oscillator signal of frequency f is then applied to a programmable frequency divider for frequency dividing the controlled oscillator signal by a divisor $N_T$. The programmable divider includes a first prescaler for frequency dividing the controlled oscillator signal by one of two predetermined integer divisors, M and M'. The output of the first prescaling means is then counted in a counter circuit so that an output signal is generated when the counter has counted a given number of signal pulses C. In addition, the output of the first prescaler is applied to a second prescaler for frequency dividing by one of two predetermined integer divisors P and P'. The frequency divided output of the second prescaler is then applied to a frequency divider so that the output signal of the divider is a signal of frequency $f/N_T$. A control circuit controls the first prescaler and the counter circuit such that the counter circuit is enabled when the first prescaler is dividing the input signal by its divisor Q' and such that the first prescaler is actuated from its Q' divisor to its Q divisor in response to the output signal from the first counter circuit and such that the first prescaler is actuated from its Q divisor to its Q' divisor in response to the output signal from the frequency divider circuit.

It can be seen that the invention as described eliminates the need for one large high speed prescaler to enable the synthesizer to operate at very high frequencies. This is a result of the fact that only the first prescaler need be capable of operating at the very high frequencies. The overall result is an improved frequency synthesizer which can operate at very high frequencies without excessive manufacturing costs and excessive current drain while retaining the capability of being programmable in frequency increments equal to the reference frequency. It is therefore highly suitable for high frequency mobile and portable radio applications.

BRIEF DESCRIPTION OF THE DRAWINGS

The features of the present invention which are believed to be novel are set forth with particularity in the appended claims. The invention, together with further objects and advantages thereof, may best be understood by reference to the following description when taken in conjunction with the accompanying drawings.

DESCRIPTION OF THE PREFERRED EMBODIMENT OF THE INVENTION

Figure 1:
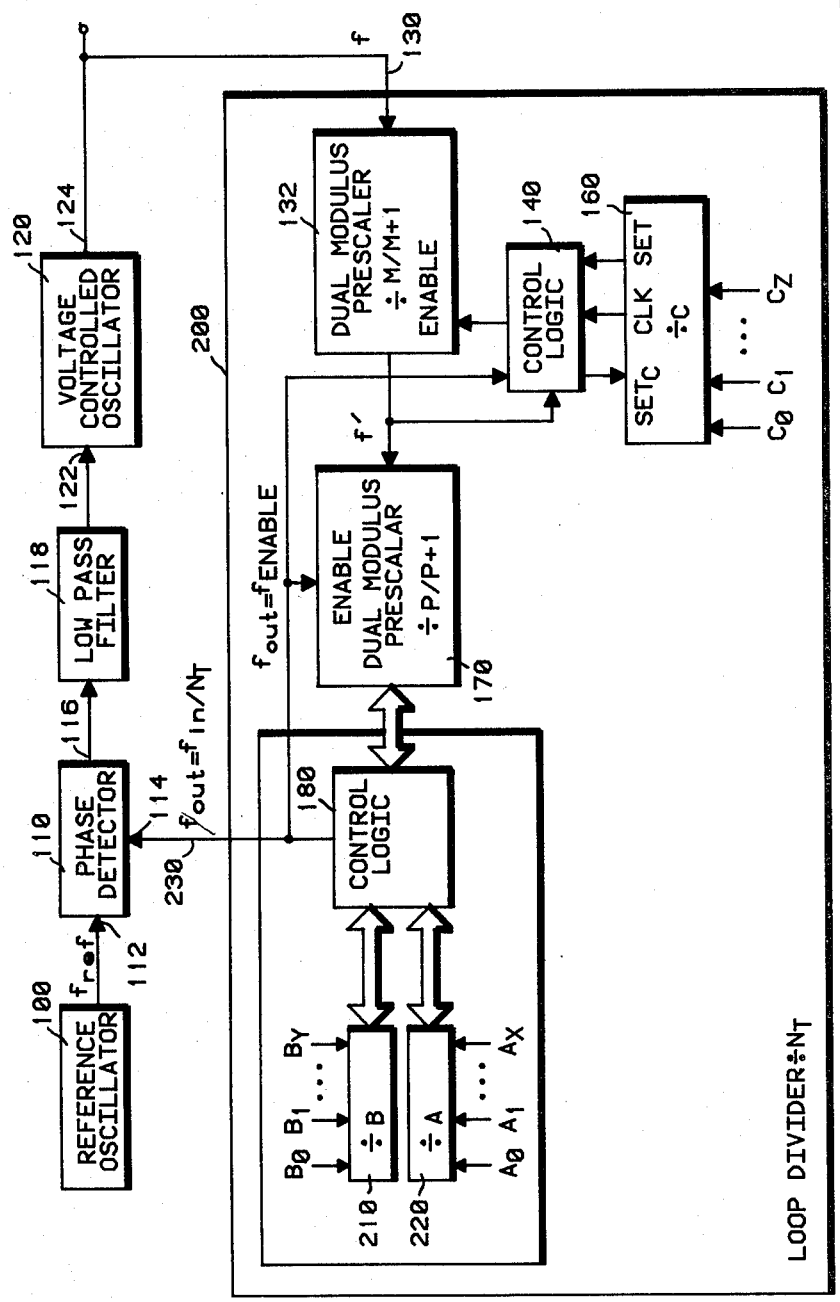
FIG. 1 is a block diagram illustrating the inventive frequency synthesizer utilizing multiple dual modulus prescalers.

FIG. 1 is a block diagram of a frequency synthesizer according to the invention. As shown therein, a phase locked loop is utilized including a reference oscillator 100 which produces a reference signal of a frequency $f_{REF}$. The signal of frequency $f_{REF}$ is fed to the first input 112 of a phase detector 110 (an example of which is a Motorola type MC4044). The phase detector 110 has a second input 114 and an output 116. Acting in the conventional manner, the phase detector 110 produces an error signal at its output 116 which error signal is representative of the phase difference between the signals received at the input terminals 112 and 114.

The output error signal at the output terminal 116 of the phase detector 110 is optionally low pass filtered through an optional low pass filter circuit 118 and applied to the control input 122 of a voltage controlled oscillator 120 (for example, a Motorola type MC1648). The voltage controlled oscillator 120 produces an oscillator signal of predetermined frequency at its output 124 responsive to a control signal (i.e., the phase detector error signal) received at the control input 122.

Figure 2:
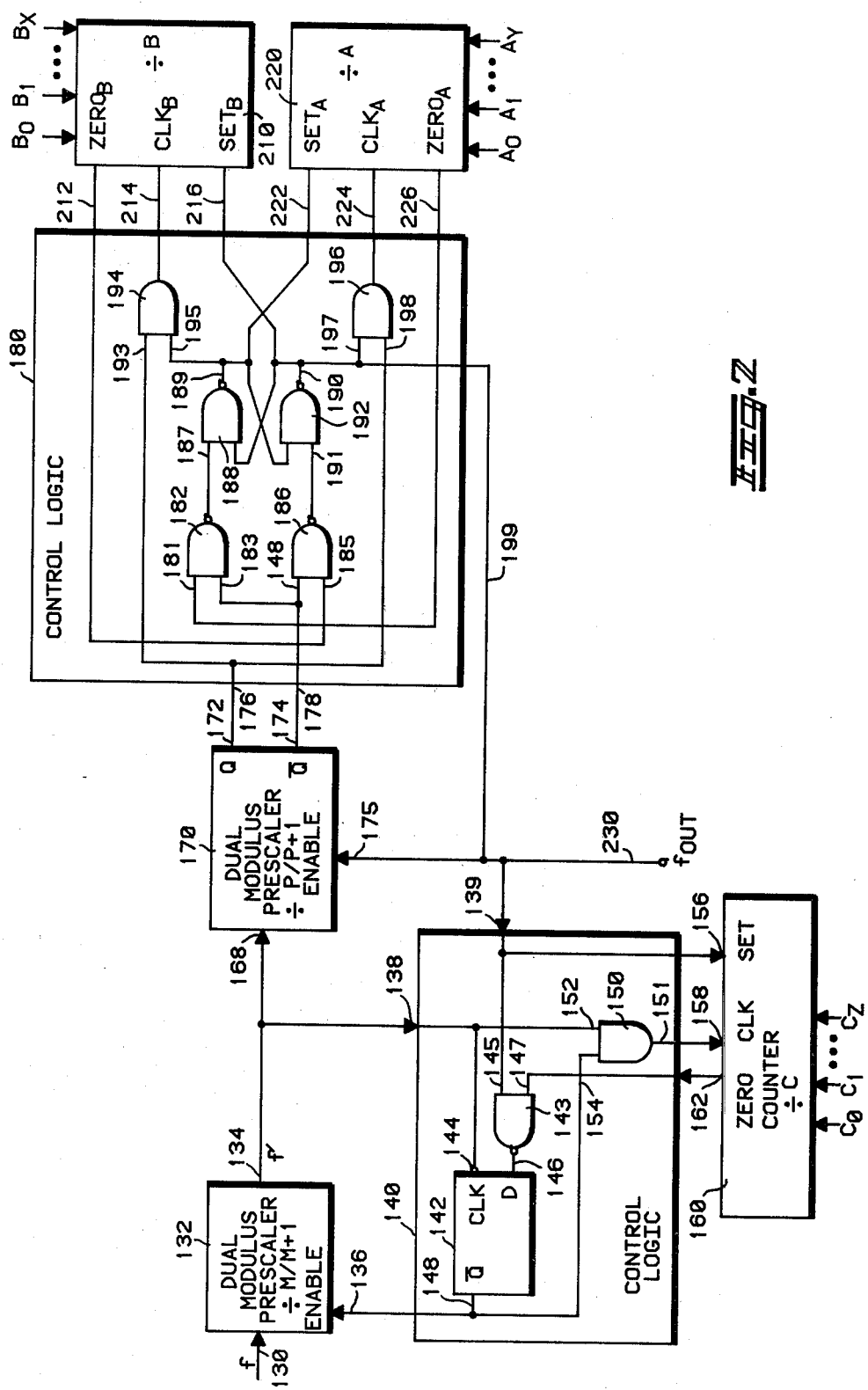
FIG. 2 is a schematic diagram illustrating in greater detail the multiple dual modulus prescaler circuit illustrated in FIG. 1.

The output terminal 124 of the voltage controlled osciallator 120 feeds to the input terminal 130 of a loop divider 200 (The loop divider 200 is shown in greater detail in FIG. 2). The loop divider 200 responds to the signal of frequency f at its input 130 to divide the signal received at the input 130 by an integer number $N_T$. The output 230 of the loop divider 200 is coupled to the second phase detector input 114 thereby applying to the input 114 a signal of frequency $f/N_T$.

In order to change the frequency at the output terminal 124, the divide ratio $N_T$ must be changed to a new value. The frequency of the signal at the output terminal 124 will be equal to the reference oscillator frequency $f_{REF}$ times the divide ratio $N_T$ (i.e., $f = f_{REF} \times N_T$). Thus in order to have the capability of generating frequencies with increments of $f_{REF}$, the loop divider 200 must have a divide ratio $N_T$ which is programmable in increments of one.

The loop divider utilizing two dual modulus prescalers as shown in FIG. 1 is not only easily programmable in increments of one, but is also highly suited for high frequency operation. For a more detailed description of the operation of the loop divider shown in FIG. 1, reference will be made to FIG. 2 which is a schematic diagram of the loop divider 200 shown in FIG. 1.

Referring now to FIG. 2, a signal of frequency f from the control oscillator 120 (See FIG. 1) is applied to the input 130 of a dual modulus prescaler 132 with moduli M and M' where M' is equal to M+1 in the preferred embodiment. (An example of a commercially available dual modulus prescaler is a Motorola type MC12012.) The dual modulus prescaler 132 produces a frequency divided signal at its output 134. This output 134 is coupled both to the input 138 of a control logic circuit 140 and the input 168 of a second dual modulus prescaler 170.

The signal at the output 134 of the dual modulus prescaler 132 will have a frequency, indicated as f', equal to the frequency f divided by the divisor M or M+1. This signal is then applied to the input 138 of the control logic 140 and is thereby coupled directly to the clock input 144 of a D flip-flop 142 and to the input 152 of an AND gate 150. The $\overline{Q}$ output 148 of the D flip-flop 142 is coupled directly to the enable input 136 of the dual modulus prescaler 132 and directly to the input 154 of the AND gate 150. In addition, a signal applied to a second input 139 of the control logic 140 is coupled to the input 145 of a NAND gate 143 and to the set input 156 of a counter 160 (preferably programmable of modulus C. The programmable counter 160 is programmed via inputs $C_0$–$C_Z$ and its clock signal is supplied at the clock input 158 from the output 151 of the AND gate 150. The zero output 162 of the counter 160 is coupled to the second input 147 of the NAND gate 143. The output of the NAND gate 143 is then coupled directly to the D input 146 of the D flip-flop 142.

The divided signal f' at the output 134 of the dual modulus prescaler 132 is also applied to the input 168 of the second dual modulus prescaler 170. The second dual modulus prescaler 170 produces a divided signal at its Q output 172 and at its $\overline{Q}$ output 174. The Q output 172 is coupled to the input 176 of the counter control logic 180 and the $\overline{Q}$ ouput 174 is coupled to the input 178 of the control logic 180. The control logic 180 is composed of AND gates and NAND gates. A counter 210, to divide by the number B and a counter 220, to divide by the number A are also coupled to the control logic 180 as shown. The B counter 210 and the A counter 220 are preferably programmable down counters (programmable via the inputs $B_0$–$B_Y$ and $A_0$–$A_X$, respectively). These counters are coupled to the control logic so as to frequency divide the signal of F' to produce a divided output frequency $f_{OUT}$ at the output 230, as indicated. This output signal of frequency $f_{OUT}$ is coupled to the output 230 and to the input 139 of control logic 140.

The divider circuit shown in FIG. 2 functions as follows. The signal of frequency $f_{OUT}$ applied to the input 139 is coupled to the set input of the C counter 160 and the input 145 of the NAND gate 143. When the signal of frequency $f_{OUT}$ on the SET input 156 is low, the counter C is set to its programmed value. When the signal on the input 139 of the control logic 140 goes high, a high will be applied to the input 145 of NAND gate 143 and since the counter C has been set by the previous low, there will be a high on its zero output 162 which is then applied to the input 147 of the NAND gate 143. This results in a low output from the NAND gate 143 which is applied to the input 146 of the D flip-flop. As a result, the divided signal of frequency f' out of the first dual modulus prescaler 132 which is applied to the input 138 and to the clock input of the D flip-flop 142, will cause the D flip-flop to change states so that the $\overline{Q}$ output 148 is high. This high output is then applied to the enable input 136 of the dual modulus prescaler 132 which causes it to change to a divisor of M+1. At the same time the high on the $\overline{Q}$ output 148 is applied to the input 154 of the AND gate 150. This enables the AND gate 150 so that the signal on the input 138 of control logic 140 is transmitted through the AND gate 150 to its output 151 and applied to the clock input 158 of the C counter 160. As a result, the C counter begins to count down to zero. When the C counter reaches a zero value, the zero output 162 will go low thus applying a low to the input 147 of the NAND gate 143. This results in a high at the output of the NAND gate 143 which is then applied to the input 146 of the D flip-flop. With the high on the input 146 of the D flip-flop, a clock signal on the input 144 will cause the flip-flop to change states so that the $\overline{Q}$ output 148 goes to a low. The low on the output 148 is coupled to the enable input 136 of the dual modulus prescaler 132 causing it to change to the M divisor. At the same time the low on the $\overline{Q}$ output 148 is coupled to the input 154 of AND gate 150 thus disabling it and preventing the clock signals from reaching the clock input of the C counter 160, thereby disabling the C counter 160. Thus, the C counter is enabled when the dual modulus prescaler is in the M+1 divisor state and is disabled when it is in the M divisor state.

When the signal of frequency $f_{OUT}$ applied to the input 139 of control logic 140 goes low, the counter C will be reset to its programmed value. In addition, the low will be applied to the input 145 of the NAND gate 143 resulting in a high being applied to the input 146 of the D flip-flop. As a result, the D flip-flop will remain in a state with $\overline{Q}$ being low and the dual modulus prescaler will maintain its state of division by M while the C counter remains disabled. However, when the signal of frequency $f_{OUT}$ which is applied to the input 139 goes high, the C counter will again be enabled and the dual modulus prescaler 132 will again shift to the M+1 divisor state. Thus, the signal f applied to the input 130 is divided alternately by the divisor M and M+1 by the prescaler 132.

The divided signal of frequency f' is then applied to the input 168 of the second dual modulus prescaler 170. This signal of frequency f' will be divided by the prescaler 170 by a modulus P or P' where P'=P+1 in the preferred embodiment. The modulus will be determined by a signal applied to the enable input 175 of the prescaler 170. The divided signal on the Q output 172 is coupled to the input 176 of the control logic 180. Within the control logic 180 the signal applied to the input 176 is coupled directly to the input 193 of an AND gate 194 and to the input 198 of an AND gate 196. A second input 195 of the AND gate 194 and a second input 197 of the AND gate 196 are controlled by a flip-flop composed of the NAND gates 188 and 192, as shown.

Thus, when the flip-flop composed of gates 188 and 148 is in the state such that the output 189 of the NAND gate 188 is high, then the output 190 of the NAND gate 192 will be low. As a result, the gate 194 will be enabled since the high on the output 189 is coupled to the input 195 of the gate 194 and the gate 196 will be disabled since the low from the output 190 is applied to the input 197 of the AND gate 196. As a result, the signal from the Q output 172 applied to the input 193 of the AND gate 194 will be gated through to the $CLK_B$ input 214 of the B counter 210. In addition, the output 189 of the NAND gate 188 is coupled to the $SET_A$ input 222 of the A counter 220. Since the output 189 of the gate 188 was high, the $SET_A$ input 222 will also be high which will cause the A counter to reset.

The low on the output 190 of the NAND gate 192 which is applied to the input 197 of the AND gate 196 disables that gates thus preventing the signal from the Q output 172 from being applied to the $CLK_A$ input 224 of the A counter 220. This low on the output 190 is also applied to the $SET_B$ input 216 of the B counter 210 which allows the B counter 210 to be decremented by the signal on the $CLK_B$ input 214.

When the value of the B counter 210 has been decremented all the way to zero, a high is generated on the $ZERO_B$ output 212. This signal is coupled directly to the input 185 of a NAND gate 186. In addition, the $\overline{Q}$ signal from the output 174 of the dual modulus prescaler 170 is coupled to the counter control logic input 178 and applied to the second input 184 of the NAND gate 186. The resulting signal from the NAND gate 186 is coupled to the input 191 of the NAND gate 192, which causes the flip-flop composed of gates 188 and 192 to change to its opposite state.

The new state results in the output 189 of the NAND gate 188 going low and the output 190 of the NAND gate 192 going high. Therefore, the input 195 of the AND gate 194 will be low thus disabling the AND gate 194, and the input 197 of the AND gate 196 will be high thus enabling the AND gate 196. The result of this is that the signal from the Q output 172 of the prescaler 170 is now gated through the AND gate 196 and applied to the $CLK_A$ input 224 of the A counter 220. Simultaneously, the same signal from the prescaler output 172 is blocked by the disabled AND gate 194 so that no signal is applied to the $CLK_B$ input 214 of the B counter 210. In addition the high on the output 190 of the NAND gate 192 is applied to the $SET_B$ input 216 of the B counter 210. This causes the B counter to be reset. The low on the output 189 of the NAND gate 188 is also applied to the $SET_A$ input 222 of the A counter 220, which allows the A counter 220 to be decremented by the signal on the $CLK_A$ input 224. This results in the B counter 210 being set while the A counter 220 is decrementing.

When the A counter 220 has decremented all the way to zero, a high signal is generated on its $ZERO_A$ output 226 which is applied to the input 181 of the NAND gate 182. This signal, together with the signal from the $\overline{Q}$ output 174 applied to the input 183 of NAND gate 182 from the control logic input 178, results in a signal applied to the input 187 of the NAND gate 188 causing the flip-flop composed of NAND gates 188 and 192 to change to the opposite state. As a result of the change in state, the B counter 210 will begin to decrement and the A counter 220 will be reset in the same manner as described previously.

The signal which occurs on the SET$_B$ input 216 of the B counter 210 is also coupled via the feedback line 199 to the enable input 175 of the dual modulus prescaler 170. Whenever a transition occurs at the enable input 175, the modulus of the prescaler 170 will be changed. In the preferred embodiment of the divider, the prescaler 170 will have a modulus of P during the B count and a modulus of P+1 during the A count.

The signal on the feedback line 199 is also coupled to the output 230. Thus, the signal on the output 190 of the NAND gate 192 is coupled to the output 230. The frequency $f_{OUT}$ of the output signal will be equal to the input frequency f' divided by the divide ratio N where N will be given by the following formula:

$$N = P(B) + A(P+1) = P(A+B) + A.$$

As can be seen from the formula, the divide ratio can be incremented by one of the process of reprogramming the value of B to be reduced by one and reprogramming the value of A to be increased by one, resulting in the net increase in the divide ratio N of one.

It should also be noted that there are additional schemes which have been developed to permit the divide function accomplished by the control logic 80 and the A and B counters which permit the divide ratio to be reprogrammed in increments of one. An example of another such system is that disclosed in a patent to Miller et al., U.S. Pat. No. 4,053,739 assigned to Motorola, Inc.

As described previously, the frequency F' is equal to the input frequency f divided alternately by M and M+1. Referring to the previous analysis, it can be seen that the overall divide ratio $N_T$ from the input 130 to the output 230 is given by the following formula:

$$N_T = (M+1)C + M(N-C) = M(P(A+B)+A) + C$$

In the preferred embodiment the value of C is made at least equal to M and the value of A is equal at least to P. Under these conditions it can be seen that the value of $N_T$ can be programmed in increments of one by appropriate changes in the values of A, B and C. In addition, in the preferred embodiment, the value of M is made to be small so that a small very high speed prescaler can be used thereby permitting the divider to operate at very high speeds while maintaining low cost and low current drain.

Thus, an improved frequency synthesizer is provided which is capable of operating at very high speeds and is particularly suited for radio communication system applications. The frequency synthesizer not only has the capability of operating at very high frequencies, but also maintains minimum current drain and minimum manufacturing costs.

While a preferred embodiment of the invention has been described and shown, it should be understood that other variations and modifications may be implemented. It is therefore complemented to cover, by the present application, any and all modifications and variations that fall within the true spirit and scope of the basic underlying principles disclosed and claimed herein.

What is claimed is:

1. An improved frequency synthesizer comprising:
   (a) a reference signal source for generating a reference signal;
   (b) a phase comparator, having a first input coupled to the signal source, a second input and an output, for producing at the output a control signal representative of the phase difference of signals received at the first and second input;
   (c) a signal controlled oscillator for producing an oscillator signal of frequency f at its output in response to the phase comparator control signal; and
   (d) divider means for frequency dividing the controlled oscillator signal by a divisor $N_T$ and applying the divided signal to the second input of the phase comparator including,
   first prescaler means for frequency dividing the controlled oscillator signal by one of two predetermined integer divisors M and M' and producing a divided output signal,
   means for counting the output signals from the first prescaler and producing an output signal when C signals have been counted when said counting means is enabled,
   second prescaling means for frequency dividing the output signal of the first prescaling means by one of two predetermined integer divisors P and P', and producing a divided output signal,
   frequency dividing means, coupled to the second prescaler, for frequency dividing the output signal of the second prescaler to produce an output signal of frequency $f/N_T$ at an output, and
   means for controlling the first prescaler and the counting means such that the counting means is enabled when the first prescaler is dividing the input signal by M' and such that the first prescaler is actuated from its M' divisor to its M divisor in response to the output signal from the counter means, and such that the first prescaler is actuated from its M divisor to its M' divisor in response to the output signal of the frequency dividing means.

2. The improved frequency synthesizer of claim 1 wherein the counting means is programmable.

3. The improved frequency synthesizer of claims 1 or 2 wherein the frequency dividing means is programmable such that divisor from the output of the first prescaler to the output of the dividing means is programmable in increments of one.

4. The improved high frequency synthesizer of claims 1 or 2 wherein the frequency dividing means comprises:
   means for frequency dividing the second prescaler divided output signal by a divisor A;
   means for frequency dividing the second prescaler divided output signal by a divisor B;
   logic means for controlling the second prescaling means and the dividing means so that the second prescaler divided output signal is alternately frequency divided by A and B, and the dividing means is preset while the division by B is occurring and the B dividing means is preset while the division by A is occurring, said logic means including means for actuating the second prescaling means from its P' divisor to its P divisor upon transition from the A divisor to the B divisor and from its P divisor to its P' divisor upon transition from the B divisor to the A divisor.

5. The improved frequency synthesizer of claim 1, or 2 further comprising:
   means, coupled to the phase comparator output and to the signal controlled oscillator, for processing the control signal from the phase comparator to produce a filtered control signal and for applying the filtered control signal to the controlled oscillator.

6. A high speed frequency divider responsive to a source of input signals of frequency f, comprising:
- first prescaling means for frequency dividing the input signal by one of two predetermined integer divisors M and M' and producing a divided output signal;
- means for counting the output signals from the first prescaler and producing an output signal when C signals have been counted when the counting means is enabled;
- second prescaling means for frequency dividing the output signal of the first prescaling means by one of two predetermined integer divisors P and P' and producing a divided output signal;
- frequency dividing means, coupled to the second prescaler, for frequency dividing the output signal of the second prescaler to produce an output signal of frequency F divided by N; and
- means for controlling the first prescaler and the counting means such that the counting means is enabled when the first prescaler is dividing the input signal by M', and such that the first prescaler is actuated from its M' divisor to its M divisor in response to the output signal from the counter means, and such that the first prescaler is actuated from its M divisor to its M' divisor in response to the output signal from the frequency dividing means.

7. The high speed frequency divider of claim 6, wherein the counting means is programmable.

8. The high speed frequency divider of claim 6 or 7, wherein the frequency dividing means further comprises:
- means for frequency dividing the second prescaler divided output signal by divisor A;
- means for frequency dividing the second prescaler divided output signal by divisor B;
- logic means for controlling the second prescaling means and the dividing means so that the second prescaler divided output signal is alternately frequency divided by A and B, and the A dividing means is preset while the division by B is occurring and the B dividing means is preset while the division by A is occurring; said logic means including means for actuating the second prescaling means from its P' divisor to its P divisor upon the transition from the A divisor to the B divisor and from its P divisor to its P' divisor upon transition from the B divisor to the A divisor.

9. A high speed frequency divider of claim 8, wherein the A divider means and the B divider means are programmable.

* * * * *

UNITED STATES PATENT AND TRADEMARK OFFICE
CERTIFICATE OF CORRECTION

PATENT NO. : 4,316,151
DATED : February 16, 1982
INVENTOR(S) : William Jay Ooms

It is certified that error appears in the above—identified patent and that said Letters Patent is hereby corrected as shown below:

Column 8 , line 54 before "dividing" insert --A--

Column 8 , line 63 delete "claim" and insert --claims--

Column 10, line 5 delete "claim" and insert --claims--

Signed and Sealed this

Twenty-third Day of November 1982

[SEAL]

Attest:

GERALD J. MOSSINGHOFF

Attesting Officer     Commissioner of Patents and Trademarks